United States Patent
Toda et al.

(10) Patent No.: US 7,629,623 B2
(45) Date of Patent: *Dec. 8, 2009

(54) NITRIDE-BASED SEMICONDUCTOR DEVICE AND METHOD OF FABRICATING THE SAME

(75) Inventors: Tadao Toda, Kyoto (JP); Tsutomu Yamaguchi, Nara (JP); Masayuki Hata, Kadoma (JP); Yasuhiko Nomura, Moriguchi (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/139,807

(22) Filed: Jun. 16, 2008

(65) Prior Publication Data

US 2008/0315221 A1    Dec. 25, 2008

Related U.S. Application Data

(60) Continuation of application No. 11/806,709, filed on Jun. 4, 2007, now abandoned, which is a continuation of application No. 11/607,896, filed on Dec. 4, 2006, which is a division of application No. 11/114,193, filed on Apr. 26, 2005, which is a division of application No. 10/936,499, filed on Sep. 9, 2004, now Pat. No. 6,890,779, which is a division of application No. 10/394,260, filed on Mar. 24, 2003, now Pat. No. 6,791,120.

(30) Foreign Application Priority Data

Mar. 26, 2002  (JP) ............................. 2002-085085

(51) Int. Cl.
*H01L 27/15* (2006.01)
*H01L 29/40* (2006.01)

(52) U.S. Cl. .............................. 257/99; 257/79; 257/81; 257/E33.062

(58) Field of Classification Search ................... 257/79, 257/81, 99, E33.062
See application file for complete search history.

(56) References Cited

U.S. PATENT DOCUMENTS 5,493,577 A    2/1996   Choquette et al.

(Continued)

FOREIGN PATENT DOCUMENTS

JP    06-275911    9/1994

(Continued)

OTHER PUBLICATIONS

Notice of office action mailed on Feb. 15, 2008 in a counterpart Chinese application No. 200610095905.7.

(Continued)

*Primary Examiner*—David Vu
*Assistant Examiner*—Earl N Taylor
(74) *Attorney, Agent, or Firm*—Marvin A. Mostenbocker; Mots Law, PLLC

(57) ABSTRACT

A method of fabricating a nitride-based semiconductor device capable of reducing contact resistance between a nitrogen face of a nitride-based semiconductor substrate or the like and an electrode is provided. This method of fabricating a nitride-based semiconductor device comprises steps of etching the back surface of a first semiconductor layer consisting of either an n-type nitride-based semiconductor layer or a nitride-based semiconductor substrate having a wurtzite structure and thereafter forming an n-side electrode on the etched back surface of the first semiconductor layer.

26 Claims, 4 Drawing Sheets

U.S. PATENT DOCUMENTS

| | | |
|---|---|---|
| 6,111,277 A | 8/2000 | Ikeda |
| 6,153,010 A | 11/2000 | Kiyoku et al. |
| 6,211,089 B1 | 4/2001 | Kim et al. |
| 6,242,761 B1 | 6/2001 | Fujimoto et al. |
| 6,380,051 B1 | 4/2002 | Yuasa et al. |
| 6,399,966 B1 | 6/2002 | Tsuda et al. |
| 6,455,340 B1 | 9/2002 | Chua et al. |
| 6,455,877 B1 * | 9/2002 | Ogawa et al. ............... 257/99 |
| 6,468,347 B1 | 10/2002 | Motoki et al. |
| 6,515,308 B1 | 2/2003 | Kneissl et al. |
| 6,518,602 B1 | 2/2003 | Yuasa et al. |
| 6,551,848 B2 | 4/2003 | Kwak et al. |
| 6,566,231 B2 | 5/2003 | Ogawa et al. |
| 6,576,054 B1 | 6/2003 | Melnik et al. |
| 6,614,824 B2 | 9/2003 | Tsuda et al. |
| 6,738,403 B2 | 5/2004 | Kuniyasu et al. |
| 6,741,623 B2 | 5/2004 | Ishikawa et al. |
| 6,791,120 B2 * | 9/2004 | Toda et al. ............... 257/103 |
| 6,803,603 B1 | 10/2004 | Nitta et al. |
| 6,940,103 B2 | 9/2005 | Kiyoku et al. |
| 6,999,486 B2 | 2/2006 | Kuniyasu et al. |
| 7,083,679 B2 | 8/2006 | Kiyoku et al. |
| 2002/0011599 A1 | 1/2002 | Motoki et al. |
| 2005/0202682 A1 | 9/2005 | Kiyoku et al. |

FOREIGN PATENT DOCUMENTS

| | | |
|---|---|---|
| JP | 09-1299330 | 5/1997 |
| JP | 9-266352 | 10/1997 |
| JP | 10-190038 | 7/1998 |
| JP | 10-190059 | 7/1998 |
| JP | 11-215910 A | 9/1998 |
| JP | 11-4048 A | 1/1999 |
| JP | 11-330622 A1 | 11/1999 |
| JP | 11-340571 | 12/1999 |
| JP | 2000-44400 | 2/2000 |
| JP | 2000-068553 A1 | 3/2000 |
| JP | 2000-332343 A1 | 11/2000 |
| JP | 2001-68786 | 3/2001 |
| JP | 2001-148357 A | 5/2001 |
| JP | 2001-148533 | 5/2001 |
| JP | 2001-176823 | 6/2001 |
| JP | 2001-192300 | 7/2001 |
| JP | 2001-313441 | 11/2001 |
| JP | 2001-322899 A1 | 11/2001 |
| JP | 2001-345266 | 12/2001 |
| JP | 2001-358364 | 12/2001 |
| JP | 2002-026456 | 1/2002 |
| JP | 2002-33305 | 1/2002 |
| JP | P2002-26438 A | 1/2002 |
| JP | 2002-158393 A | 5/2002 |
| JP | 2002-299769 A | 10/2002 |
| JP | 2003-051614 | 2/2003 |
| JP | 2004-6718 | 1/2004 |

OTHER PUBLICATIONS

Notice of office action mailed on Jan. 22, 2008 in a counterpart Japanese application (No. JP2008-348155).

Notice of office action mailed on Jan. 22, 2008 in a counterpart Japanese application (No. JP2006-348156).

Notice of office action mailed on Jan. 22, 2008 in a counterpart Japanese application (No. JP2006-348161).

Joon Seop Kwak et al., "Crystal-polarity dependence of Ti/Al contacts to freestanding n-GaN substrate," Applied Physics Letters, Nov. 12, 2001. p. 3254-3256, vol. 79, No. 20, American Institute of Physics.

Notice of office action mailed on Aug. 14, 2007 in a counterpart Japanese application No. 2006-348155.

Notice of office action mailed on Aug. 14, 2007 in a counterpart Japanese application No. 2006-348156.

Notice of office action mailed on Aug. 14, 2007 in a counterpart Japanese application No. 2006-348161.

Notice of office action mailed on Aug. 14, 2007 in a counterpart Japanese application No. 2006-348164.

Notice of office action mailed on Jun. 22, 2007 in a counterpart Chinese application No. 200510128698.6.

Notice of office action mailed on Aug. 10, 2007 in a related U.S. Appl. No. 11/114,193.

"The Adsorption of Oxygen At GaN Surfaces" 1999 American Institute of Physics, Applied Physics Letters, vol. 74, No. 12. Mar. 22, 1999 pp. 1695-1697.

* cited by examiner

NITRIDE-BASED SEMICONDUCTOR DEVICE AND METHOD OF FABRICATING THE SAME

RELATED APPLICATIONS

This application is a continuation of application Ser. No. 11/806,709, filed on Jun. 4, 2007, now abandoned which is a continuation of application Ser. No. 11/607,896, filed on Dec. 4, 2006, which is a divisional of application Ser. No. 11/114,193, filed on Apr. 26, 2005, which is a divisional of application Ser. No. 10/936,499, filed on Sep. 9, 2004, now U.S. Pat. No. 6,890,779, which is a divisional of application Ser. No. 10/394,260, filed on Mar. 24, 2003, now U.S. Pat. No. 6,791,120, which in turn claims the benefit of Japanese patent application no. 2002-85085, filed on Mar. 26, 2002, the disclosures of which applications are incorporated by reference herein.

BACKGROUND OF THE INVENTION

1. Field of the Invention

The present invention relates to a nitride-based semiconductor device and a method of fabricating the same, and more particularly, it relates to a nitride-based semiconductor device having an electrode and a method of fabricating the same.

2. Description of the Background Art

A nitride-based semiconductor laser device has recently been expected as a light source for an advanced large capacity optical disk, and actively developed.

In general, an insulating sapphire substrate is employed for forming a nitride-based semiconductor laser device. When a nitride-based semiconductor layer is formed on the sapphire substrate, however, a large number of defects (dislocations) are disadvantageously formed in the nitride-based semiconductor layer due to large difference between the lattice constants of the sapphire substrate and the nitride-based semiconductor layer. Consequently, the characteristics of the nitride-based semiconductor laser device are disadvantageously reduced.

In this regard, a nitride-based semiconductor laser device employing a nitride-based semiconductor substrate such as a GaN substrate having small difference in lattice constant with respect to a nitride-based semiconductor layer is proposed in general.

FIG. 7 is a sectional view showing a conventional nitride-based semiconductor laser device employing an n-type GaN substrate 101. Referring to FIG. 7, nitride-based semiconductor layers (102 to 110) are grown on a Ga face ((HKLM) plane: M denotes a positive integer) to be improved in crystallinity in a process of fabricating the conventional nitride-based semiconductor laser device. A nitrogen face ((HKL-M) plane: M denotes a positive integer) of the n-type GaN substrate 101 having a wurtzite structure is employed as the back surface, so that an n-side electrode 112 is formed on this back surface of the n-type GaN substrate 101. The fabrication process for the conventional nitride-based semiconductor laser device to now described in detail.

As shown in FIG. 7, an n-type layer 102 consisting of n-type GaN having a thickness of about 3 μm, an n-type buffer layer 103 consisting of n-type $In_{0.05}Ga_{0.95}N$ having a thickness of about 100 nm, an n-type cladding layer 104 consisting of n-type $Al_{0.05}Ga_{0.95}N$ having a thickness of about 400 nm, an n-type light guide layer 105 consisting of n-type GaN having a thickness of about 70 nm, an MQW (multiple quantum well) active layer 106 having an MQW structure, a p-type layer 107 consisting of p-type $Al_{0.2}Ga_{0.8}N$ having a thickness of about 200 nm, a p-type light guide layer 108 consisting of p-type GaN having a thickness of about 70 nm, a p-type cladding layer 109 consisting of p-type $Al_{0.05}Ga_{0.95}N$ having a thickness of about 400 nm and a p-type contact layer 110 consisting of p-type GaN having a thickness of about 100 nm are successively formed on the upper surface (Ga face) of the n-type GaN substrate 101 having a thickness of about 300 μm to about 500 μm.

Then, a p-side electrode 111 is formed on a prescribed region of the upper surface of the p-type contact layer 110. The back surface of the n-type GaN substrate 101 is polished until the thickness of the n-type GaN substrate 101 reaches a prescribed level of about 100 μm, and an n-side electrode 112 is thereafter formed on the back surface (nitrogen face) of the n-type GaN substrate 101. Finally, the n-type GaN substrate 101 and the layers 102 to 110 are cleft thereby performing element isolation and forming a cavity facet. Thus, the conventional nitride-based semiconductor laser device shown in FIG. 7 is completed.

In the conventional nitride-based semiconductor laser device shown in FIG. 7, however, the n-type GaN substrate 101 is so hard that it is difficult to excellently perform device isolation and form the cavity facet by cleavage. In order to cope with such inconvenience, a method of mechanically polishing the back surface of the n-type GaN substrate 101 before the cleavage step for reducing irregularity on the back surface thereby excellently performing element isolation and forming the cavity facet is proposed. This method is disclosed in Japanese Patent Laying-Open No. 2002-26438, for example.

In the aforementioned conventional method disclosed in Japanese Patent Laying-Open No. 2002-26438, however, stress is applied in the vicinity of the back surface of the n-type GaN substrate 101 when the back surface of the n-type GaN substrate 101 is mechanically polished. Therefore, microscopic defects such as cracks are disadvantageously formed in the vicinity of the back surface of the n-type GaN substrate 101. Consequently, contact resistance between the n-type GaN substrate 101 and the n-side electrode 112 formed on the back surface (nitrogen face) thereof is disadvantageously increased.

Further, the nitrogen face of the n-type GaN substrate 101 is so easily oxidized that the contact resistance between the n-type GaN substrate 101 and the n-side electrode 112 formed on the back surface (nitrogen face) thereof is disadvantageously increased also by this.

SUMMARY OF THE INVENTION

An object of the present invention is to provide a method of fabricating a nitride-based semiconductor device capable of reducing contact resistance between the back surface of a nitride-based semiconductor substrate or the like and an electrode.

Another object of the present invention is to reduce the number of defects in the vicinity of the back surface of the nitride-based semiconductor substrate or the like in the aforementioned method of fabricating a nitride-based semiconductor device.

Still another object of the present invention is to provide a nitride-based semiconductor device capable of reducing contact resistance between the back surface of a nitride-based semiconductor substrate or the like and an electrode.

In order to attain the aforementioned objects, a method of fabricating a nitride-based semiconductor device according to a first aspect of the present invention comprises steps of etching the back surface of a first semiconductor layer consisting of either an n-type nitride-based semiconductor layer or a nitride-based semiconductor substrate having a wurtzite structure and thereafter forming an n-side electrode on the etched back surface of the first semiconductor layer.

In the method of fabricating a nitride-based semiconductor device according to the first aspect, the back surface of the first semiconductor layer consisting of either an n-type nitride-based semiconductor layer or a nitride-based semiconductor substrate having a wurtzite structure is etched as hereinabove described, whereby a region including defeats in the vicinity of the back surface of the first semiconductor layer resulting from a polishing step or the like can be removed for reducing the number of defects in the vicinity of the back surface of the first semiconductor layer. Thus, an electron carrier concentration can be inhibited from reduction resulting from trap of electron carriers by defects, so that the electron carrier concentration can be increased on the back surface of the first semiconductor layer. Consequently, contact resistance between the first semiconductor layer and the n-side electrode can be reduced. Further, the back surface of the first semiconductor layer is so etched that flatness thereof can be improved as compared with that of a mechanically polished back surface. Thus, the n-side electrode formed on the back surface of the first semiconductor layer can also be improved in flatness, whereby adhesion between the n-side electrode and a radiator base can be improved when the former is mounted on the latter. Consequently, excellent radiability can be attained. Further, the n-side electrode formed on the back surface of the first semiconductor layer can be so improved in flatness that wire bondability with respect to the n-side electrode can be improved when the n-side electrode is wire-bonded.

In the aforementioned method of fabricating a nitride-based semiconductor device according to the first aspect, the back surface of the first semiconductor layer preferably includes a nitrogen face of the first semiconductor layer. The term "nitrogen face" denotes a wide concept indicating not only a complete nitrogen face but also a surface mainly formed by a nitrogen face. More specifically, the term "nitrogen face" includes a surface having a nitrogen face of at least 50% in the present invention. When formed by a nitrogen face, the back surface of the first semiconductor layer is so easily oxidized that the oxidized portion of the back surface can be removed by etching. Thus, contact resistance between the first semiconductor layer and the n-side electrode can be further reduced.

In the aforementioned method of fabricating a nitride-based semiconductor device according to the first aspect, the etching step preferably includes a step of etching the back surface of the first semiconductor layer by dry etching. According to this structure, the back surface of the first semiconductor layer can be easily improved in flatness and the number of defects can be reduced in the vicinity of the back surface due to the dry etching.

In the aforementioned method of fabricating a nitride-based semiconductor device including the step of etching the back surface of the first semiconductor layer by dry etching, the step of etching the back surface of the first semiconductor layer by dry etching preferably includes a step of etching the back surface of the first semiconductor layer by reactive ion etching with $Cl_2$ gas and $BCl_3$ gas. According to this structure, the back surface of the first semiconductor layer can be easily improved in flatness and the number of defects can be easily reduced in the vicinity of the back surface. In this case, the ratio of the flow rate of $BCl_3$ gas to the flow rate of $Cl_2$ gas in the step of etching the back surface of the first semiconductor layer by the reactive ion etching is preferably at least 30% and not more than 70%. It has been experimentally confirmed that the back surface of the first semiconductor layer can be improved in flatness in this range of the ratio of the flow rate of $BCl_3$ gas to that of $Cl_2$ gas, and hence the back surface of the first semiconductor layer can be reliably improved in flatness by setting the ratio within this range.

In the aforementioned method of fabricating a nitride-based semiconductor device including the step of etching the back surface of the first semiconductor layer by dry etching, the etching depth and the etching time in the step of etching the back surface of the first semiconductor layer by dry etching are preferably proportional to each other. According to this structure, the etching depth can be accurately controlled by adjusting the etching time.

In the aforementioned method of fabricating a nitride-based semiconductor device according to the first aspect, the etching step preferably includes a step of etching the back surface of the first semiconductor layer thereby converting the back surface of the first is semiconductor layer to a mirror surface. According to this structure, the back surface of the first semiconductor layer can be further improved in flatness.

The aforementioned method of fabricating a nitride-based semiconductor device according to the first aspect preferably further comprises a step of performing heat treatment after the step of forming the n-side electrode. According to this structure, contact resistance between the first semiconductor layer and the n-side electrode can be further reduced.

In the aforementioned method of fabricating a nitride-based semiconductor device according to the first aspect, the etching step preferably includes a step of etching the back surface of the first semiconductor layer by a thickness of at least about 1 μm. According to this structure, a region including defects in the vicinity of the back surface of the first semiconductor layer resulting from a polishing step or the like can be so sufficiently removed that the number of defects can be further reduced in the vicinity of the back surface of the first semiconductor layer.

In the aforementioned method of fabricating a nitride-based semiconductor device according to the first aspect, the first semiconductor layer may include the n-type nitride-based semiconductor layer or the nitride-based semiconductor substrate consisting of at least one material selected from a group consisting of GaN, BN, AlN, InN and TlN. Further, the n-side electrode may include an Al film.

In the aforementioned method of fabricating a nitride-based semiconductor device according to the first aspect, the nitride-based semiconductor device is preferably a nitride-based semiconductor light-emitting device. According to this structure, contact resistance between the first semiconductor layer and the n-side electrode can be reduced in the nitride-based semiconductor light-emitting device, whereby the nitride-based semiconductor light-emitting device can attain excellent emissivity.

The aforementioned method of fabricating a nitride-based semiconductor device according to the first aspect preferably further comprises a step of dipping a nitrogen face of the etched first semiconductor layer in a solution containing at least one of chlorine, fluorine, bromine, iodine, sulfur and ammonium in advance of the step of forming the n-side electrode. According to this structure, residues resulting from etching can be easily removed from the back surface of the first semiconductor layer. Thus, contact resistance between the first semiconductor layer and the n-side electrode can be further reduced. In this case, the method of fabricating a nitride-based semiconductor device further comprises a step of performing hydrochloric acid treatment on the back surface of the first semiconductor layer with an HCl solution in advance of the step of forming the n-side electrode. According to this structure, chlorine-based residues adhering to the back surface of the first semiconductor layer due to the etching can be easily removed.

The aforementioned method of fabricating a nitride-based semiconductor device according to the first aspect preferably further comprises a step of polishing the back surface of the first semiconductor layer in advance of the etching step. Also when polishing the back surface of the first semiconductor layer, the back surface of the first semiconductor layer can be improved in flatness and the number of defects resulting from polishing can be reduced in the vicinity of the back surface through the etching step following the polishing step.

In the aforementioned method of fabricating a nitride-based semiconductor device according to the first aspect, the etching step preferably includes a step of etching the back surface of the first semiconductor layer by wet etching. According to this structure, the back surface of the first semiconductor layer can be easily improved in flatness and the number of defects can be easily reduced in the vicinity of the back surface due to the wet etching. In this case, the step of etching the back surface of the first semiconductor layer by wet etching preferably includes a step of etching the back surface of the first semiconductor layer with at least one etchant selected from a group consisting of aqua regia, KOH and $K_2S_2O_8$. Further, the step of etching the back surface of the first semiconductor layer by wet etching preferably includes a step of etching the back surface of the first semiconductor layer while increasing the temperature to about 120° C. According to this structure, the etching rate can be increased to about 10 times that in wet etching carried out under the room temperature.

A method of fabricating a nitride-based semiconductor device according to a second aspect of the present invention comprises steps of etching a nitrogen face of a first semiconductor layer consisting of either an n-type nitride-based semiconductor layer or a nitride-based semiconductor substrate having a wurtzite structure by dry etching and thereafter forming an n-side electrode on the etched nitrogen face of the first semiconductor layer.

In the method of fabricating a nitride-based semiconductor device according to the second aspect, the nitrogen face of the first semiconductor layer consisting of either an n-type nitride-based semiconductor layer or a nitride-based semiconductor substrate having a wurtzite structure is etched by dry etching as hereinabove described, whereby a region including defects in the vicinity of the first semiconductor layer resulting from a polishing step or the like can be so reduced that the number of defects can be reduced in the vicinity of the nitrogen face of the first semiconductor layer. Thus, reduction of an electron carrier concentration resulting from trap of electron carriers by defects can be suppressed, whereby the electron carrier concentration can be increased in the nitrogen face of the first semiconductor layer. Consequently, contact resistance between the first semiconductor layer and the n-side electrode can be reduced. Further, the nitrogen face of the first semiconductor layer is so etched by dry etching that flatness thereof can be improved as compared with that of a mechanically polished nitrogen face. Thus, the n-side electrode formed on the nitrogen face of the first semiconductor layer can also be improved in flatness, whereby adhesion between the n-side electrode and a radiator base can be improved when the former is mounted on the latter. Consequently, high radiability can be attained. Further, the n-side electrode formed on the nitrogen face of the first semiconductor layer can be so improved in flatness that wire bondability with respect to the n-side electrode can be improved when the n-side electrode is wire-bonded.

A nitride-based semiconductor device according to a third aspect of the present invention is formed through steps of etching the back surface of a first semiconductor layer consisting of either an n-type nitride-based semiconductor layer or a nitride-based semiconductor substrate having a wurtzite structure and thereafter forming an n-side electrode on the etched back surface of the first semiconductor layer.

In the nitride-based semiconductor device according to the third aspect, a region including defects in the vicinity of the first semiconductor layer resulting from a polishing step or the like can be removed by etching the back surface of the first semiconductor layer consisting of either an n-type nitride-based semiconductor layer or a nitride-based semiconductor substrate having a wurtzite structure as hereinabove described, whereby the number of defects can be reduced in the vicinity of the back surface of the first semiconductor layer. Thus, an electron carrier concentration can be inhibited from reduction resulting from trap of electron carriers by defects, whereby the electron carrier concentration can be increased on the back surface of the first semiconductor layer. Consequently, contact resistance between the first semiconductor layer and the n-side electrode can be reduced. Further, the back surface of the first semiconductor layer is so etched that flatness thereof can be improved as compared with that of a mechanically polished back surface. Thus, the n-side electrode formed the back surface of the first semiconductor layer can also be improved flatness, whereby adhesion between the n-side electrode and a radiator base can be improved when the former is mounted on the latter. Further, the n-side electrode formed on the back surface of the first semiconductor layer can be so improved in flatness that wire bondability with respect to the n-side electrode can be improved when the n-side electrode is wire-bonded.

A nitride-based semiconductor device according to a fourth aspect of the present invention comprises a first semiconductor layer consisting of either an n-type nitride-based semiconductor layer or a nitride-based semiconductor substrate having a wurtzite structure and an n-side electrode formed on the back surface of the first semiconductor layer, while contact resistance between the n-side electrode and the first semiconductor layer is not more than 0.05 $\Omega cm^2$.

In the nitride-based semiconductor device according to the fourth aspect, the contact resistance between the n-side electrode and the first semiconductor layer is set to not more than 0.05 $\Omega cm^2$, so that the nitride-based semiconductor device can attain excellent device characteristics by reducing the contact resistance between the n-side electrode and the first semiconductor layer.

In the aforementioned nitride-based semiconductor device according to the fourth aspect, an electron carrier concentration is preferably at least $1 \times 10^{17}$ cm$^{-3}$ in the vicinity of the interface between the first semiconductor layer and the n-side electrode. According to this structure, the nitride-based semiconductor device can easily reduce the contact resistance between the n-side electrode and the first semiconductor layer.

In the aforementioned nitride-based semiconductor device according to the fourth aspect, a dislocation density is preferably not more than $1 \times 10^9$ cm$^{-2}$ in the vicinity of the interface between the first semiconductor layer and the n-side electrode. According to this structure, the number of defects (dislocations) can be reduced in the vicinity of the interface between the first semiconductor layer and the n-side electrode, whereby the contact resistance can be reduced in the interface between the first semiconductor layer and the n-side electrode.

In the aforementioned nitride-based semiconductor device according to the fourth aspect, the back surface of the first semiconductor layer preferably includes a nitrogen face of the first semiconductor layer.

In the aforementioned nitride-based semiconductor device according to the fourth aspect, the first semiconductor layer may include the n-type nitride-based semiconductor layer or the nitride-based semiconductor substrate consisting of at least one material selected from a group consisting of GaN, BN, AlN, InN and TlN. Further, the n-side electrode may include an Al film.

In the aforementioned nitride-based semiconductor device according to the fourth aspect, the nitride-based semiconductor device is preferably a nitride-based semiconductor light-emitting device. According to this structure, contact resistance between the first semiconductor layer and the n-side electrode can be reduced in the nitride-based semiconductor light-emitting device, whereby the nitride-based semiconductor light-emitting device can attain excellent emissivity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
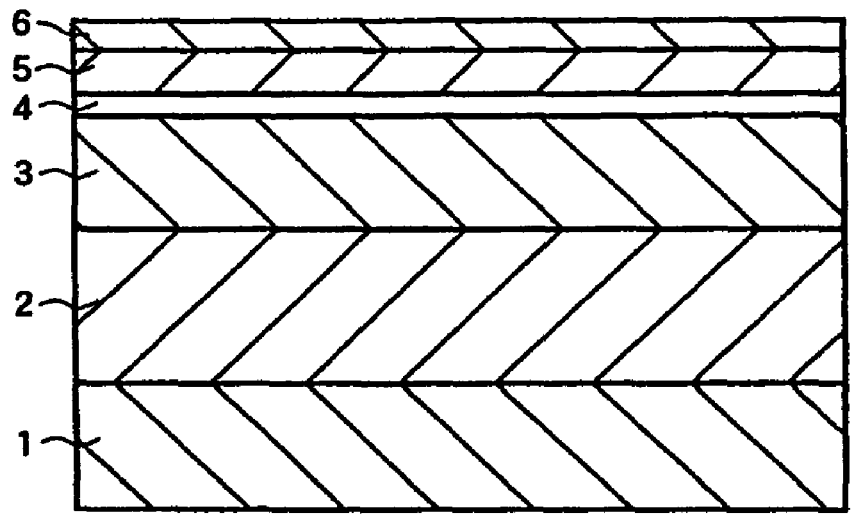
FIGS. 1 to 3 are sectional views for illustrating a process of fabricating a nitride-based semiconductor laser device according to an embodiment of the present invention.

An embodiment of the present invention is now described with reference to the drawings.

A process of fabricating a nitride-based semiconductor laser device according to the embodiment is described with reference to FIGS. 1 to 5. According to this embodiment, an oxygen-doped n-type GaN substrate 1 having a wurtzite structure is formed by a method disclosed in Japanese Patent Laying-Open No. 2000-44400, for example. More specifically, an oxygen-doped n-type GaN layer is formed on a GaAs substrate (not shown) by HVPE with a thickness of about 120 µm to about 400 µm. Thereafter the GaAs substrate is removed thereby obtaining the n-type GaN substrate 1 shown in FIG. 1. The n-type GaN substrate 1 has a substrate carrier concentration of $5 \times 10^{18}$ cm$^{-3}$ according to Hall effect measurement. The impurity concentration of the n-type GaN substrate 1 according to SIMS (secondary ion mass spectroscopy) analysis is $1 \times 10^{19}$ cm$^{-3}$. The n-type GaN substrate 1 is an example of the "first semiconductor layer" in the present invention.

An n-type buffer layer 2 consisting of n-type GaN having a thickness of about 5 µm, an n-type cladding layer 3 consisting of n-type $Al_{0.08}Ga_{0.92}N$ having a thickness of about 1 µm, an MQW active layer 4 consisting of InGaN, a p-type cladding layer 5 consisting of p-type $Al_{0.08}Ga_{0.92}N$ having a thickness of about 0.28 µm and a p-type contact layer 6 consisting of p-type GaN having a thickness of about 70 nm are successively formed on the upper surface (Ga face), i.e., the (0001) plane of the n-type GaN substrate 1 by atmospheric pressure MOCVD under a pressure of about 1 atm (about 100 kPa).

The MQW active layer 4 is formed by alternately stacking four barrier layers of GaN each having a thickness of about 20 nm and three well layers of $In_{0.15}Ga_{0.85}N$ each having a thickness of about 3.5 nm. $Ga(CH_3)_3$, $In(CH_3)_3$, $Al(CH_3)_3$ and $NH_3$ are employed as material gases, and $H_2$ and $N_2$ are employed as carrier gases. According to this embodiment, the quantities of these material gases are varied for adjusting the compositions of the layers 2 to 6. $SiH_4$ gas (Si) is employed as the n-type dopant for the n-type buffer layer 2 and the n-type cladding layer 3. $Cp_2Mg$ gas (Mg) is employed as the p-type dopant for the p-type cladding layer 5 and the p-type contact layer 6.

Figure 2:
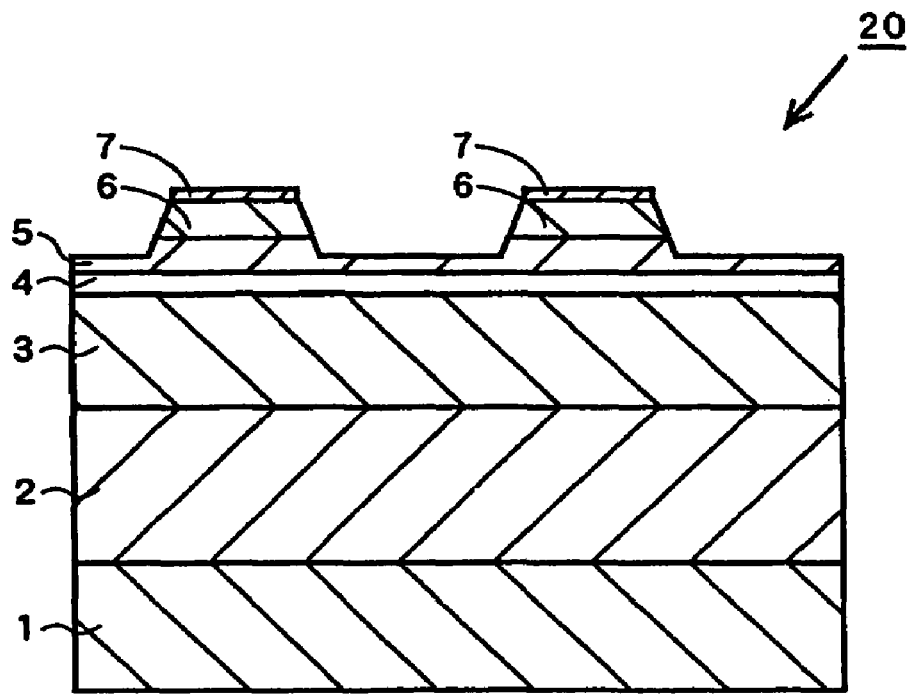

Then, the p-type contact layer 6 and the p-type cladding layer 5 are partially etched through photolithography and etching, thereby forming projecting portions—(ridge portions) of about 2 µm in thickness consisting of projecting portions of the p-type cladding layer 5 and p-type contact layers 6, as shown in FIG. 2. Then, p-side electrodes 7 consisting of Pt films having a thickness of about 1 nm. Pd films having a thickness of about 10 nm and Ni films having a thickness of about 300 nm in ascending order are formed on the upper surfaces of the p-type contact layers 6. Thus, a nitride-based semiconductor laser device structure 20 is formed to include a region formed with a plurality of elements as shown in FIG. 2.

Figure 3:
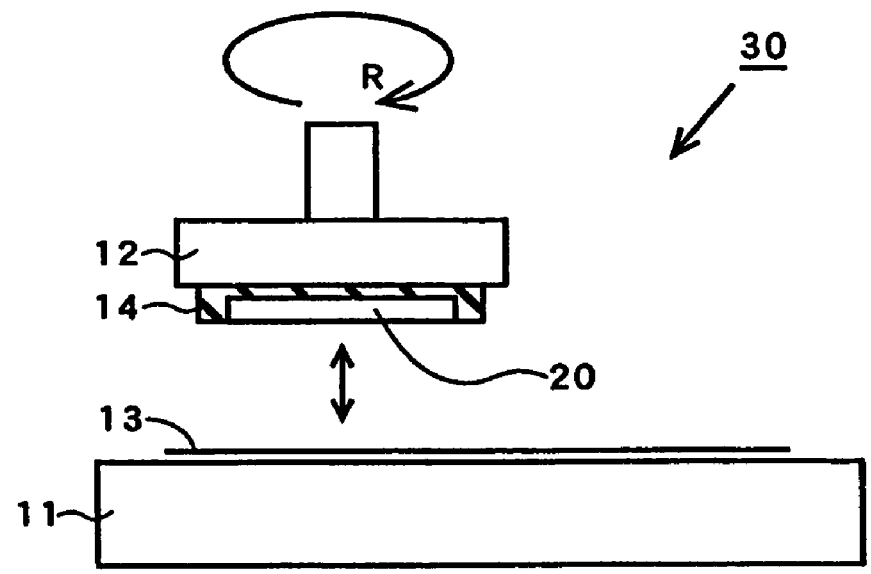
Figure 4:
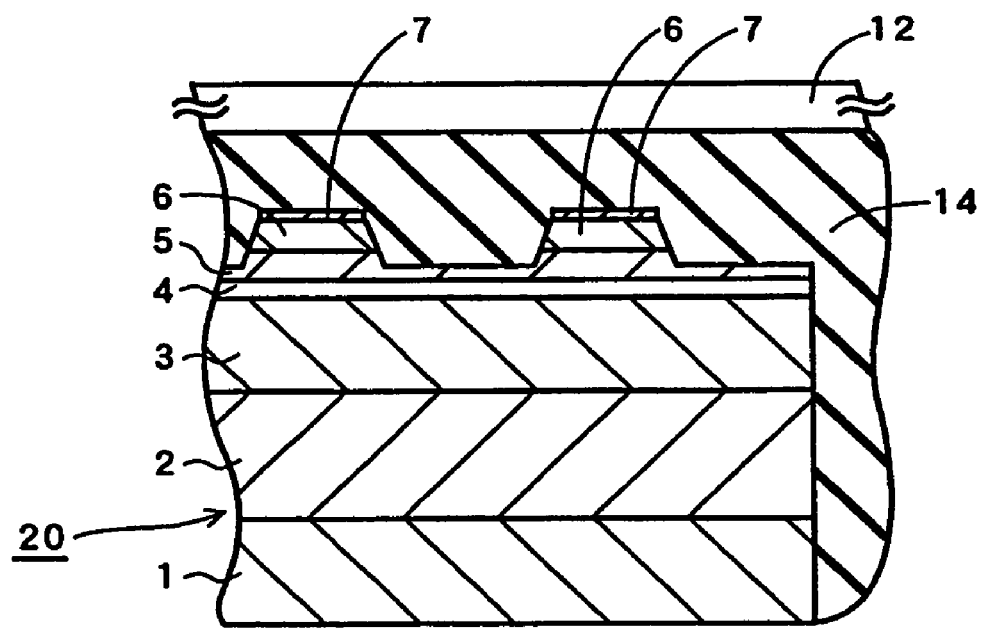
FIG. 4 is an enlarged sectional view in the step shown in FIG. 3.

Thereafter the back surface (nitrogen face) of the n-type GaN substrate 1 is mechanically polished as shown in FIGS. 3 and 4. A mechanical polisher 30 employed for this polishing step is formed by a glass plate 11 having a flat surface, a holder 12 supported to be vertically movable and rotatable along arrow R and a buff 13, as shown in FIG. 3. An abrasive (not shown) consisting of diamond, silicon oxide or alumina having particle roughness of about 0.2 µm to about 1 µm is arranged on the buff 13. This abrasive can particularly excellently polish the back surface of the n-type GaN substrate 1 if the particle roughness thereof is in the range of about 0.2 µm to about 0.5 µm. The nitride-based semiconductor laser device structure 20 is mounted on the lower surface of the holder 12 at an interval-through wax 14 not to directly come into contact with the holder 12, as shown in FIGS. 3 and 4. Thus, the nitride-based semiconductor laser device structure 20 is prevented from breaking in mechanical polishing. A flat polishing plate made of metal may be used instead of the glass plate 11.

The mechanical polisher 30 shown in FIG. 3 is employed for polishing the back surface (nitrogen face) of the n-type GaN substrate 1 so that the thickness of the n-type GaN substrate 1 reaches about 120 µm to about 180 µm. More specifically, the back surface (see FIG. 4) of the n-type GaN substrate 1 of the nitride-based semiconductor laser device structure 20 mounted on the lower surface of the holder 12 is pressed against the upper surface of the buff 13 provided with the abrasive with a constant load. The holder 12 is rotated along arrow R while feeding water or oil to the buff 13 (see FIG. 3). Thus, the back surface of the n-type GaN substrate 1 is polished until the thickness of the n-type GaN substrate 1 reaches about 120 µm to about 180 µm. The n-type GaN substrate 1 is worked so that the thickness thereof is in the range of about 120 µm to about 180 µm, since a cleavage step described later can be excellently carried out when the thickness of the n-type GaN substrate 1 is within this range.

According to this embodiment, the back surface (nitrogen-face) of the n-type GaN substrate 1 is thereafter etched for about 20 minutes by reactive ion etching (RIE). This etching is carried out under conditions of a $Cl_2$ gas flow rate of 10 sccm, a $BCl_3$ gas flow rate of 5 sccm, an etching pressure of about 3.3 Pa and RF power of 200 W (0.63 W/cm$^2$) under the room temperature. Thus, the back surface (nitrogen face) of the n-type GaN substrate 1 is removed by a thickness of about 1 µm. Consequently, a region, including defects resulting from the aforementioned mechanical polishing, in the vicinity of the back surface of the n-type GaN substrate 1 can be removed. Further, the back surface of the n-type GaN substrate 1 can be worked into a flatter mirror surface as compared with that worked by only mechanical polishing. The mirror surface is defined as a surface state allowing excellent visual confirmation of a reflected image of the back surface of the n-type GaN substrate 1.

In order to confirm the effect of the aforementioned etching, the defect (dislocation) density on the back surface of the n-type GaN substrate 1 was measured before and after etching by TEM (transmission electron microscope) analysis. Consequently, it has been proved that the defect density, which was at least $1 \times 10^{10}$ cm$^{-2}$ before etching, was reduced to below $1 \times 10^6$ cm$^{-2}$ after the etching. Further, the electron carrier concentration in the vicinity of the back surface of the etched n-type GaN substrate 1 was measured with an electrochemical C-V profiler. Consequently, the electron carrier concentration in the vicinity of the back surface of the etched n-type GaN substrate 1 was at least $1.0 \times 10^{18}$ cm$^{-3}$. Thus, it has been recognized that the electron carrier concentration in the vicinity of the back surface can be set to a level substantially identical to the substrate carrier concentration ($5 \times 10^{18}$ cm$^{-3}$) of the n-type GaN substrate 1.

Figure 6:
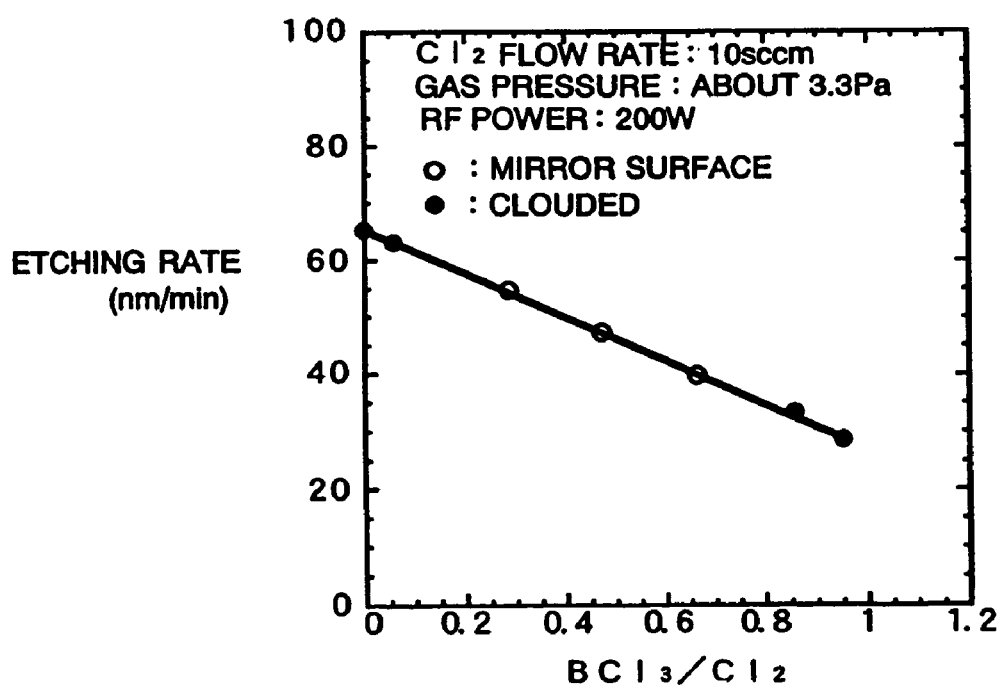
FIG. 6 is a graph showing change of an etching rate in a case of varying the etching gas ratio in RIE.
Figure 7:
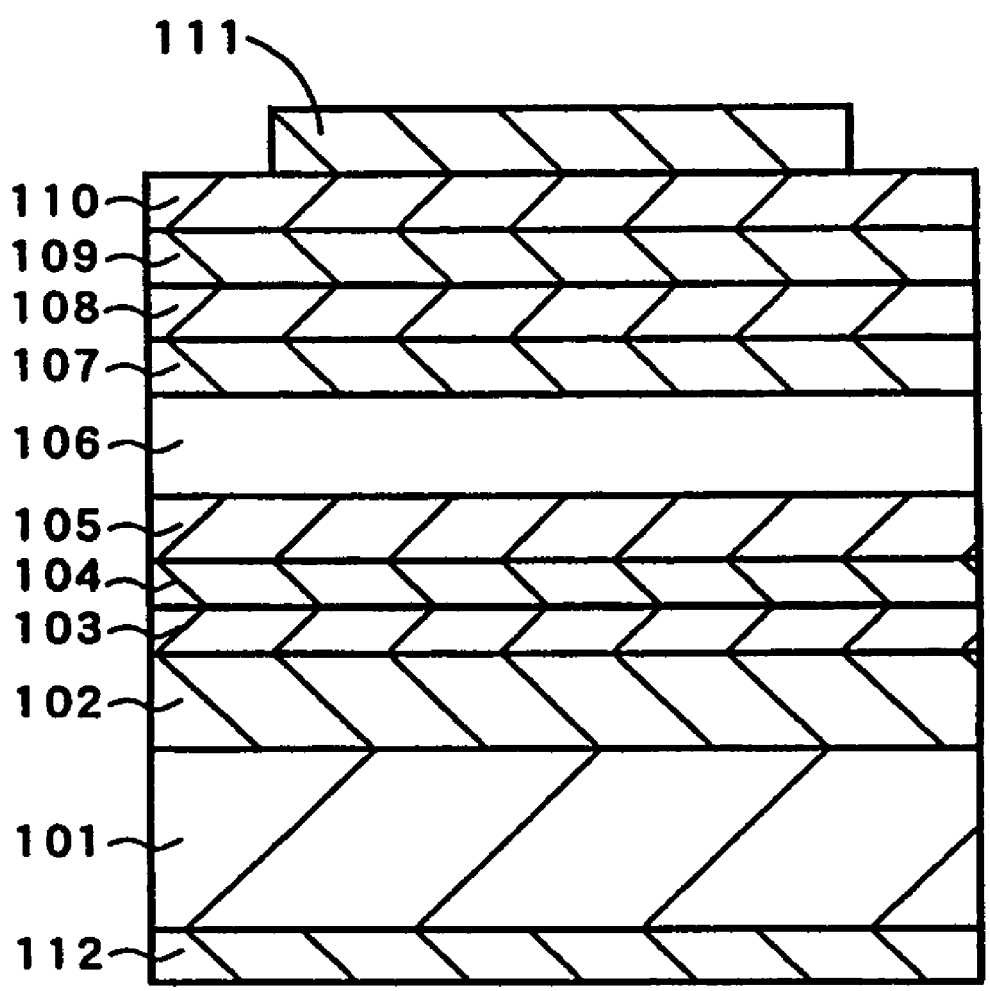
FIG. 7 is a sectional view showing a conventional nitride-based semiconductor laser device.

Under the aforementioned etching conditions, the etching time and the etching depth are proportional to each other. Therefore, the etching depth can be accurately controlled by adjusting the etching time. The etching rate and the surface state vary with the composition of etching gases. FIG. 6 is a graph showing change of the etching rate upon variation of the etching gas ratio in RIE. In this case, the $Cl_2$ gas flow rate was fixed to 10 sccm and the $BCl_3$ gas flow rate was varied for measuring the etching rate. Consequently, it has been proved that the etched surface is converted to a flat mirror surface when the ratio of the $BCl_3$ gas flow rate to the $Cl_2$ gas flow rate is in the range of at least 30% and not more than 70%, as shown in FIG. 6. When the ratio of the $BCl_3$ gas flow rate to the $Cl_2$ gas flow rate was less than 5% or in excess of 85%, the etched surface was damaged in flatness and clouded.

After the aforementioned etching step, the nitride-based semiconductor laser device structure 20 is dipped in an HCl solution (concentration: 10%) under the room temperature for 1 minute thereby performing hydrochloric acid treatment. Thus, chlorine-based residues adhering to the back surface of the n-type GaN substrate 1 in the RIE step are removed.

Thereafter an n-side electrode 8 consisting of an Al film having a thickness of 6 nm, an Si film having a thickness of 2 nm, an Ni film having a thickness of 10 nm and an Au film having a thickness of 300 nm successively from a side closer to the back surface of the n-type GaN substrate 1 is formed on the back surface (nitrogen face) of the n-type GaN substrate 1 of the nitride-based semiconductor laser device structure 20 by sputtering or vacuum deposition.

Figure 5:
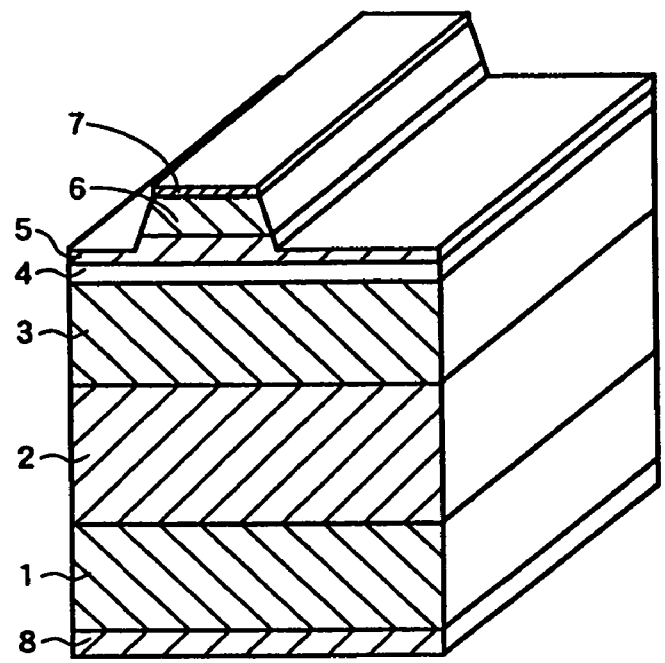
FIG. 5 is a perspective view for illustrating the process of fabricating a nitride-based semiconductor laser device according to the embodiment of the present invention.

Finally, elements are isolated and a cavity facet is formed by cleavage, thereby completing the nitride-based semiconductor laser device according to this embodiment as shown in FIG. 5.

In the process of fabricating a nitride-based semiconductor laser device according to this embodiment, the back surface (nitrogen face) of the n-type GaN substrate 1 is etched by RIE as hereinabove described, whereby the region, including defects resulting from the polishing step, in the vicinity of the back surface of the n-type GaN substrate 1 can be removed. Thus, the electron carrier concentration can be inhibited from reduction resulting from trap of electron carriers by defects. When formed by a nitrogen face, the back surface of the n-type GaN substrate 1 is easily oxidized and hence the oxidized part can be removed by etching. Consequently, the contact resistance between the n-type GaN substrate 1 and the n-side electrode 8 can be reduced. Contact resistance between the n-type GaN substrate 1 and the n-side electrode 8 of a nitride-based semiconductor laser device actually prepared according to this embodiment measured by a TLM (transmission line model) method was not more than $2.0 \times 10^{-4}$ Ωcm$^2$. When the n-side electrode 8 was formed on the back surface (nitrogen face) of the n-type GaN substrate 1 and the structure was heat-treated in a nitrogen gas atmosphere of 500° C. for 10 minutes, the contact resistance was further reduced to $1.0 \times 10^{-5}$ Ωcm$^2$.

In the process of fabricating a nitride-based semiconductor laser device according to this embodiment, the back surface of the n-type GaN substrate 1 is etched by RIE as hereinabove described, whereby the back surface of the n-type GaN substrate 1 can be further improved in flatness as compared with a mechanically polished back surface. Thus, the n-side electrode 8 formed on the back surface of the n-type GaN substrate 1 can be also improved in flatness. When the nitride-based semiconductor laser device is mounted in a junction-down system, wire bondability with respect to the n-side electrode 8 can be improved. When the n-side electrode 8 is mounted on a radiator base (submount), adhesion between the n-side electrode 8 and the radiator base can be improved for attaining excellent radiability.

In order to confirm the effect of the present invention etching the back surface (nitrogen face) of the n-type GaN substrate 1 by RIE in more detail, an experiment was performed as shown in Table 1.

TABLE 1

| Sample | Method of Forming Electrode (Back Surface Treatment Condition) | Contact Resistance (Ωcm$^2$) | Electron Carrier Concentration (cm$^{-3}$) |
|---|---|---|---|
| 1 | Polishing Back Surface of GaN Substrate →Formation of n-Side Electrode | 20 | $2.0 \times 10^{16}$ |
| 2 | Polishing Back Surface of GaN Substrate → Hydrochloric Acid Treatment → Formation of n-Side Electrode | 0.1 | $5.0 \times 10^{16}$ |
| 3 | Polishing Back Surface of GaN Substrate →Etching by 0.5 µm by RIE ($Cl_2$ Gas)→ Formation of n-Side Electrode | 0.05 | $1.0 \times 10^{17}$ |
| 4 | Polishing Back Surface of GaN Substrate →Etching by 1 µm by RIE ($Cl_2$ Gas)→ Formation of n-Side Electrode | $7.0 \times 10^{-4}$ | $7.1 \times 10^{17}$ |
| 5 | Polishing Back Surface of GaN Substrate →Etching by 1 µm by RIE ($Cl_2$ Gas + $BCl_3$ Gas)→Formation of n-Side Electrode | $3.0 \times 10^{-4}$ | $1.7 \times 10^{18}$ |
| 6 | Polishing Back Surface of GaN Substrate →Etching by 1 µm by RIE ($Cl_2$ Gas + $BCl_3$ Gas) → Hydrochloric Acid Treatment →Formation of n-Side | $2.0 \times 10^{-4}$ | $2.5 \times 10^{18}$ |

TABLE 1-continued

| Sample | Method of Forming Electrode (Back Surface Treatment Condition) | Contact Resistance ($\Omega cm^2$) | Electron Carrier Concentration ($cm^{-3}$) |
|---|---|---|---|
| 7 | Electrode Polishing Back Surface of GaN Substrate →Etching by 1 μm by RIE ($Cl_2$ Gas + $BCl_3$ Gas) → Hydrochloric Acid Treatment →Formation of n-Side Electrode → Heat Treatment | $1.0 \times 10^{-5}$ | $5.0 \times 10^{18}$ |

Referring to Table 1, various nitrogen face (back surface) treatments were performed on samples 1 to 7 consisting of n-type GaN substrates having a wurtzite structure for thereafter measuring electron carrier concentrations in the vicinity of the back surfaces of the n-type GaN substrates with an electrochemical V-C measured concentration profiler. After this measurement of the electron carrier concentrations, n-side electrodes were formed on the back surfaces of the n-type GaN substrates of the samples 1 to 7 for measuring contact resistance values between the n-type GaN substrates and the n-side electrodes by the TLM method.

The n-side electrodes of the samples 1 to 7 were formed by Al films, Si films, Ni films and Au films, similarly to the n-side electrode 8 according to the aforementioned embodiment. Substrate polishing, etching by RIE and hydrochloric acid treatment were performed under conditions similar to those employed in the aforementioned embodiment. The sample 6 was prepared through the fabrication process according to the aforementioned embodiment.

In the inventive samples 3 to 7 prepared by etching the back surfaces of the n-type GaN substrates by RIE, contact resistance values were remarkably reduced as compared with the sample 1 prepared by a method similar to the prior art. More specifically, the sample 1 exhibited contact resistance of 20 $\Omega cm^2$, while the inventive samples 3 to 7 exhibited contact resistance of not more than 0.05 $\Omega cm^2$, conceivably for the following reason: In the inventive samples 3 to 7, regions including defects resulting from mechanical polishing in the vicinity of the back surfaces of the n-type GaN substrates were conceivably removed by RIE. Therefore, the electron carrier concentrations were inhibited from reduction resulting from defects in the vicinity of the back surfaces of the n-type GaN substrates in the inventive samples 3 to 7.

Further, the inventive samples 3 to 7 exhibited higher electron carrier concentrations in the vicinity of the back surfaces of the n-type GaN substrates as compared with the sample 1 corresponding to the prior art. More specifically, the sample 1 corresponding to the prior art exhibited an electron carrier concentration of $2.0 \times 10^{16}$ $cm^{-1}$, while the inventive samples 3 to 7 exhibited electron carrier concentrations of at least $1.0 \times 10^{17}$ $cm^{-3}$.

In the sample 4 prepared by removing the back surface of the n-type GaN substrate by a thickness of about 1 μm by RIE with $Cl_2$ gas, it was possible to attain lower contact resistance than the sample 3 prepared by removing the back surface of the n-type GaN substrate by a thickness of about 0.5 μm by with $Cl_2$ gas. This is conceivably because it was not possible to sufficiently remove the region including defects resulting from mechanical polishing in the vicinity of the back surface of the n-type GaN substrate by removing the back surface of the n-type GaN substrate by the thickness of about 0.5 μm. When defect (dislocation) densities of the back surfaces of the n-type GaN substrates were measured by TEN analysis in these samples, the sample 3 exhibited a defect density of $1 \times 10^9$ $cm^{-2}$. In the sample 4, on the other hand, no defects were observed in the field of view and the defect density was not more than $1 \times 10^6$ $cm^{-2}$. Thus it is preferable to remove the back surface of the n-type GaN substrate by a thickness of at least about 1.0 μm by RIE.

In the sample 5 subjected to RIE with $Cl_2$ gas and $BCl_3$ gas, contact resistance was further reduced as compared with the sample 4 prepared by etching the back surface of the n-type GaN substrate by RIE with only $Cl_2$ gas.

In the samples 6 and 7, corresponding to the aforementioned embodiment, prepared by etching the back surfaces of the n-type GaN substrates by RIE with $Cl_2$ gas and $BCl_3$ gas and thereafter performing hydrochloric acid treatment and the sample 7 further heat-treated in a nitrogen atmosphere of 500° C. for 10 minutes, it was possible to obtain lower contact resistance values as compared with the sample 5 subjected to neither hydrochloric acid treatment nor heat treatment. Comparing the samples 6 and 7 with each other, it has been proved that the contact resistance between the n-type GaN substrate and the n-side electrode can be further reduced and the electron carrier concentration in the vicinity of the back surface of the n-type GaN substrate can be further improved by heat treatment.

In the sample 2 dipped in an HCl solution of 10% in concentration for about 10 minutes (hydrochloric acid treatment) without RIE, it was possible to obtain lower contact resistance than the sample 1 corresponding to the prior art subjected to no hydrochloric acid treatment. More specifically, the sample 1 exhibited contact resistance of 20 $\Omega cm^2$, while the sample 2 exhibited contact resistance of 0.1 $\Omega cm^2$. This is conceivably because the back surface of the n-type GaN substrate was cleaned by the hydrochloric acid treatment.

If oxygen is employed as the n-type dopant for the n-type GaN substrate, crystallinity is reduced when the oxygen dose is increased to increase the carrier concentration in order to reduce the contact resistance. According to the present invention, however, the contact resistance can be reduced also with the oxygen dose (substrate carrier concentration: $5 \times 10^{18}$ $cm^{-3}$) for the n-type GaN substrate 1 according to the aforementioned embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the above embodiment has been described with reference to the case of forming a nitride-based semiconductor laser device with the n-type GaN substrate 1, the present invention is not restricted to this but an n-type nitride-based semiconductor substrate or a nitride-based semiconductor layer having a wurtzite structure may alternatively be employed. For example, a nitride-based semiconductor substrate or a nitride-based semiconductor layer consisting of BN (boron nitride), AlN (aluminum nitride), InN (indium nitride) or TlN (thallium nitride) is conceivable. The nitride-based semiconductor substrate or the nitride-based semiconductor layer may consist of ternary or quaternary nitride-based semiconductor thereof.

While the back surface (nitrogen face) of the n-type GaN substrate 1 is etched by RIE in the aforementioned embodiment, the present invention is not restricted to this but other dry etching may alternatively be employed. For example, reactive ion beam etching, radical etching, or plasma etching may be employed.

While the back surface (nitrogen face) of the n-type GaN substrate 1 is etched by RIE with Cl$_2$ gas and BCl$_3$ gas in the aforementioned embodiment, the present invention is not restricted to this but other etching gases may alternatively be employed. For example, a gas mixture of Cl$_2$ and SiCl$_4$, a gas mixture of Cl$_2$ and CF$_4$ or Cl$_2$ gas may be employed.

While the nitride-based semiconductor laser device structure 20 is dipped in the HCl solution (hydrochloric acid treatment) after the etching by RIE thereby removing the chlorine-based residues adhering to the back surface of the n-type GaN substrate 1 in the aforementioned embodiment, the present invention is not restricted to this but the nitride-based semiconductor layer device structure 20 may alternatively be dipped in another solution containing at least one of chlorine, fluorine, bromine, iodine, sulfur and ammonia.

While the back surface (nitrogen face) of the n-type GaN substrate 1 is mechanically polished after growing the layers 2 to 6 on the upper surface (Ga face) of the n-type GaN substrate 1 in the aforementioned embodiment, the present invention is not restricted to this but the back surface (nitrogen face) of the n-type GaN substrate 1 may alternatively be previously mechanically polished to a prescribed thickness for thereafter forming the layers 2 to 6 on the upper surface (Ga face) of the n-type GaN substrate 1. Further alternatively, the nitrogen face of the n-type GaN substrate 1 may not be mechanically polished.

While the n-type dopant and the p-type dopant for the layers 2 to 6 are prepared from Si and Mg respectively in the aforementioned embodiment, the present invention is not restricted to this but another n- or p-type dopant may alternatively be employed. For example, Se, Ge or the like may be employed as the n-type dopant. Further, Be or Zn may be employed as the p-type-dopant.

While the layers 2 to 6 are formed on the n-type GaN substrate 1 by atmospheric pressure MOCVD in the aforementioned embodiment, the present invention is not restricted to this but the layers 2 to 6 may alternatively be formed by another growth method. For example, the layers 2 to 6 may be formed by low-pressure MOCVD.

While the n-type buffer layer 2 is formed on the n-type GaN substrate 1 in the aforementioned embodiment, the present invention is not restricted to this but no n-type buffer layer 2 may be formed. In this case, the fabrication process can be simplified although the layers 3 to 6 are slightly reduced in crystallinity.

While the n-side electrode 8 is formed by the Al, Si, Ni and Au films in the aforementioned embodiment, the present invention is not restricted to this but the n-side electrode 8 may alternatively be formed by another electrode structure such as that consisting of a Ti film having a thickness of 10 nm and an Al film having a thickness of 500 nm, an Al film having a thickness of 6 nm, an Ni film having a thickness of 10 nm and an Au film having a thickness of 300 nm or an AlSi film having a thickness of 10 nm, a Zn film having a thickness of 300 nm and an Au film having a thickness of 100 nm, for example.

While a ridge structure is employed as a current narrowing structure or a transverse light confinement structure in the aforementioned embodiment, the present invention is not restricted to this but a current may alternatively be narrowed by an embedded structure employing a high-resistance blocking layer or an n-type blocking layer. Further alternatively, a light absorption layer may be formed by ion implantation or the like as a current narrowing layer or a transverse light confinement structure.

While the present invention is applied to a nitride-based semiconductor laser device in the aforementioned embodiment, the present invention is not restricted to this but may be applied to a semiconductor device employing an n-type nitride-based semiconductor layer or a nitride-based semiconductor substrate having a wurtzite structure. For example, the present invention may be applied to a MESFET (metal semiconductor field-effect transistor), a HEMT (high electron mobility transistor), a light-emitting diode (LED) device or a VCSEL (vertical cavity surface emitting laser) device requiring surface flatness, for example.

While the p- and n-side electrodes 7 and 8 have prescribed thicknesses in the aforementioned embodiment, the present invention is not restricted to this but the p- and n-side electrodes 7 and 8 may alternatively have other thicknesses. For example, the electrodes 7 and 8 may be reduced in thickness to have translucency, for employing the semiconductor laser device as a VCSEL device or an LED device. In particular, the contact resistance of the n-side electrode 8 can be sufficiently reduced according to the present invention also when the n-side electrode 8 is formed with a small thickness to have translucency.

While the back surface (nitrogen face) of the n-type GaN substrate 1 is dry-etched by RIE in the aforementioned embodiment, the present invention is not restricted to this but the back surface (nitrogen face) of the n-type GaN substrate 1 may alternatively be wet-etched. In this case, aqua regia, KOH or K$_2$S$_2$O$_8$ is employed as the wet etchant. For example, the nitrogen face forming the back surface of the n-type GaN substrate 1 may be wet-etched under the room temperature with KOH of 0.1 mol in concentration. When the temperature is increased to about 120° C. in this case, the etching rate can be increased to about 10 times as compared with that under the room temperature.

While the back surface, consisting of the nitrogen face, of the n-type GaN substrate 1 is dry-etched by RIE in the aforementioned embodiment, the present invention is not restricted to this but the back surface of the n-type GaN substrate 1 may alternatively be wet-etched when the back surface consists of a Ga face. In this case, aqua regia, KOH or K$_2$S$_2$O$_8$ is employed as the wet etchant. For example, the Ga face forming the back surface of the n-type GaN substrate 1 may be wet-etched in KOH of 0.1 mol in concentration with a mercury lamp of 365 nm under the room temperature. When the temperature is increased to about 120° C. in this case, the etching rate can be increased to about 10 times as compared with that under the room temperature.

While the n-type GaN just substrate 1 having the back surface entirely formed by a nitrogen face is employed in the aforementioned embodiment, the present invention is not restricted to this but an n-type GaN misoriented substrate having a back surface partially including a Ga face may alternatively be employed. Such back surface of the n-type GaN misoriented substrate is also included in the nitrogen face according to the present invention.

What is claimed is:

1. A nitride-based semiconductor device comprising:
 a first semiconductor layer, consisting of either an n-type nitride-based semiconductor layer having a wurtzite structure or an n-type nitride-based semiconductor substrate having a wurtzite structure; and
 an n-side electrode formed on a back surface of said first semiconductor layer,
 wherein a dislocation density is not more than $1\times10^9$ cm$^{-2}$ at the back surface, and
 contact resistance between said n-side electrode and said first semiconductor layer is not more than 0.05 $\Omega$cm$^2$.

2. The nitride-based semiconductor device according to claim 1, wherein said dislocation density is not more than $1\times10^6$ cm$^{-2}$ at the back surface.

3. The nitride-based semiconductor device according to claim 1, wherein the back surface of said first semiconductor layer includes a nitrogen face of said first semiconductor layer.

4. A nitride-based semiconductor device comprising:
a first semiconductor layer, consisting of either an n-type nitride-based semiconductor layer having a wurtzite structure or an n-type nitride-based semiconductor substrate having a wurtzite structure; and
an n-side electrode formed on a processed back surface of said first semiconductor layer,
wherein a dislocation density is not more than $1\times10^9$ cm$^{-2}$ at the back surface, and
contact resistance between said n-side electrode and said first semiconductor layer is not more than 0.05 $\Omega$cm$^2$.

5. The nitride-based semiconductor device according to claim 1, wherein said first semiconductor layer includes oxygen as an n-type dopant.

6. The nitride-based semiconductor device according to claim 5, further comprising an n-type nitride semiconductor layer on said first semiconductor layer, said n-type nitride semiconductor layer doped either Si, Se, or Ge.

7. The nitride-based semiconductor device according to claim 1, wherein the substrate carrier concentration of the n-type semiconductor is at least $5\times10^{18}$ cm$^{-3}$.

8. The nitride-based semiconductor device according to claim 1, wherein the back surface of said first semiconductor layer has a flatter mirror surface as compared with that worked only by mechanical polishing.

9. The nitride-based semiconductor device according to claim 1, wherein the back surface of said first semiconductor layer has a lower dislocation density as compared with that worked only by mechanical polishing.

10. The nitride-based semiconductor device according to claim 1, wherein said first semiconductor layer has a thickness of not more than 180 µm.

11. A nitride-based semiconductor device comprising:
a first semiconductor layer, consisting of either an n-type nitride-based semiconductor layer having a wurtzite structure or an n-type nitride-based semiconductor substrate having a wurtzite structure; and
an n-side electrode formed on a back surface of said first semiconductor layer,
wherein a dislocation density is not more than $1\times10^6$ cm$^{-2}$ in the vicinity of the interface between said first semiconductor layer and said n-side electrode and
contact resistance between said n-side electrode and said first semiconductor layer is not more than 0.05 $\Omega$cm$^2$.

12. The nitride-based semiconductor device according to claim 11, wherein an electron carrier concentration is at least $1\times10^{17}$ cm$^{-3}$ in the vicinity of the interface between said first semiconductor layer and said n-side electrode.

13. The nitride-based semiconductor device according to claim 11, wherein the back surface of said first semiconductor layer includes a nitrogen face of said first semiconductor layer.

14. The nitride-based semiconductor device according to claim 11, wherein the vicinity of the interface between said first semiconductor layer and said n-side electrode has a lower dislocation density as compared with that worked only by mechanical polishing.

15. The nitride-based semiconductor device according to claim 11, wherein said first semiconductor layer includes oxygen as an n-type dopant.

16. The nitride-based semiconductor device according to claim 15, further comprising an n-type nitride semiconductor layer on said first semiconductor layer, said n-type nitride semiconductor layer doped either-Si, Se, or Ge.

17. The nitride-based semiconductor device according to claim 11, wherein said first semiconductor layer has a thickness of not more than 180 µm.

18. The nitride-based semiconductor device according to claim 11, wherein the substrate carrier concentration of the n-type semiconductor is at least $5\times10^{18}$ cm$^{-3}$.

19. The nitride-based semiconductor device according to claim 11, wherein the back surface of said first semiconductor layer has a flatter mirror surface as compared with that worked only by mechanical polishing.

20. The nitride-based semiconductor device according to claim 11, wherein the electron carrier concentration in the vicinity of the interface between said first semiconductor layer and said n-side electrode is at least $1.0\times10^{18}$ cm$^{-3}$.

21. The nitride-based semiconductor device according to claim 11, wherein the level of the electron carrier concentration in the vicinity of the interface between said first semiconductor layer and said n-side electrode is substantially identical to that of the first semiconductor layer.

22. The nitride-based semiconductor device according to claim 4, wherein said dislocation density is not more than $1\times10^6$ cm$^{-2}$ at the back surface.

23. The nitride-based semiconductor device according to claim 4, wherein the back surface of said first semiconductor layer includes a nitrogen face of said first semiconductor layer.

24. The nitride-based semiconductor device according to claim 4, wherein the back surface of said first semiconductor layer has a flatter mirror surface as compared with that worked only by mechanical polishing.

25. The nitride-based semiconductor device according to claim 4, wherein the back surface of said first semiconductor layer has a lower dislocation density as compared with that worked only by mechanical polishing.

26. The nitride-based semiconductor device according to claim 4, wherein said first semiconductor layer has a thickness of not more than 180 µm.

* * * * *